United States Patent
Yamakado et al.

(10) Patent No.: US 11,081,362 B2
(45) Date of Patent: Aug. 3, 2021

(54) METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Yuki Yamakado, Toyama (JP); Masanori Nakayama, Toyama (JP); Katsunori Funaki, Toyama (JP); Tatsushi Ueda, Toyama (JP); Yasutoshi Tsubota, Toyama (JP); Eiko Takami, Toyama (JP); Yuichiro Takeshima, Toyama (JP); Hiroto Igawa, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/570,452

(22) Filed: Sep. 13, 2019

(65) Prior Publication Data
US 2020/0098587 A1 Mar. 26, 2020

(30) Foreign Application Priority Data
Sep. 21, 2018 (JP) .............................. JP2018-177863

(51) Int. Cl.
*H01L 21/311* (2006.01)
*H01L 21/67* (2006.01)
*H01J 37/32* (2006.01)

(52) U.S. Cl.
CPC .. *H01L 21/31116* (2013.01); *H01J 37/32449* (2013.01); *H01L 21/67253* (2013.01); *H01J 2237/3341* (2013.01)

(58) Field of Classification Search
CPC ......... H01L 21/31116; H01L 21/67253; H01L 21/31155; H01L 21/0234; H01L 21/68764;
(Continued)

(56) References Cited

U.S. PATENT DOCUMENTS 5,968,324 A * 10/1999 Cheung ................... G03F 7/091
                                                   204/192.28
9,847,221 B1   12/2017 McLaughlin et al.
(Continued)

FOREIGN PATENT DOCUMENTS

JP   2004-022902 A   1/2004
JP   2008-053308 A   3/2008
(Continued)

OTHER PUBLICATIONS

Taiwanese Office Action dated Jan. 10, 2020 for the Taiwanese Patent Application No. 108122897.
(Continued)

*Primary Examiner* — Anita K Alanko
(74) *Attorney, Agent, or Firm* — Volpe Koenig

(57) ABSTRACT

There is provided a technique that includes: (a) loading a substrate including a base and a first film containing silicon and formed on the base into a process container; (b) converting a modifying gas containing helium into plasma to generate reactive species of helium; and (c) supplying the modifying gas containing the reactive species of helium to a surface of the substrate to respectively modify the first film and an interface layer of the base constituting an interface with the first film.

17 Claims, 8 Drawing Sheets

(58) Field of Classification Search
CPC .......... H01L 21/68742; H01L 21/67011; H01J 37/32449; H01J 37/32009; H01J 2237/3341
See application file for complete search history.

(56) References Cited

U.S. PATENT DOCUMENTS

| | | | |
|---|---|---|---|
| 2003/0232491 | A1 | 12/2003 | Yamaguchi |
| 2004/0102053 | A1 | 5/2004 | Kitagawa et al. |
| 2006/0175705 | A1* | 8/2006 | Tsutsue ............... H01L 23/5329 257/758 |
| 2010/0267248 | A1* | 10/2010 | Ma ...................... H01L 21/3105 438/787 |
| 2011/0124175 | A1 | 5/2011 | Sugawara et al. |
| 2011/0183519 | A1 | 7/2011 | Kaga et al. |
| 2016/0225616 | A1* | 8/2016 | Li ....................... H01L 21/0217 |
| 2017/0213707 | A1 | 7/2017 | Matsuura |
| 2017/0250068 | A1* | 8/2017 | Ishikawa ............ H01L 21/0234 |
| 2018/0076044 | A1* | 3/2018 | Choi ................... H01L 21/3065 |
| 2019/0181002 | A1* | 6/2019 | Iijima ............... C23C 16/45523 |

FOREIGN PATENT DOCUMENTS

| | | |
|---|---|---|
| JP | 2010-027928 A | 2/2010 |
| JP | 2012-227336 A | 11/2012 |
| KR | 08-203893 A | 8/1996 |
| KR | 10-2011-0119870 A | 11/2011 |
| TW | 201118929 A | 6/2011 |
| TW | 201135844 A | 10/2011 |
| TW | 201737389 A | 10/2017 |

OTHER PUBLICATIONS

Singaporean Search Report dated Mar. 16, 2020 for the Singaporean Patent Application No. 10201908412U.
Singaporean Written Opinion dated Mar. 19, 2020 for the Singaporean Patent Application No. 10201908412U.
Japanese Office Action dated Feb. 9, 2021 for Japanese Patent Application No. 2018-177863.
Korean Office Action dated Jul. 23, 2020 for Korean Patent Application No. 10-2019-0112195.

* cited by examiner

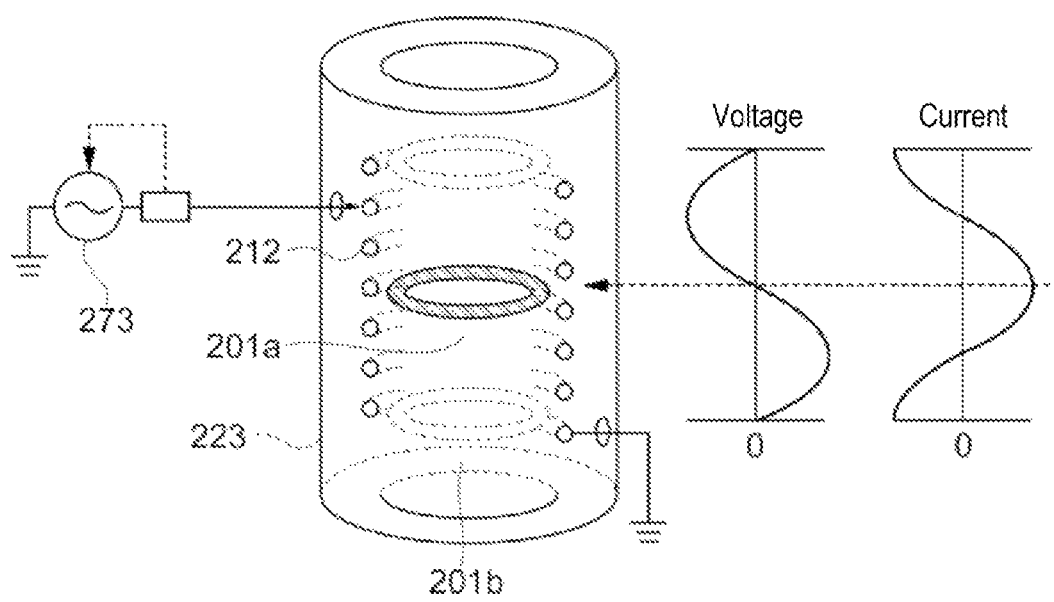

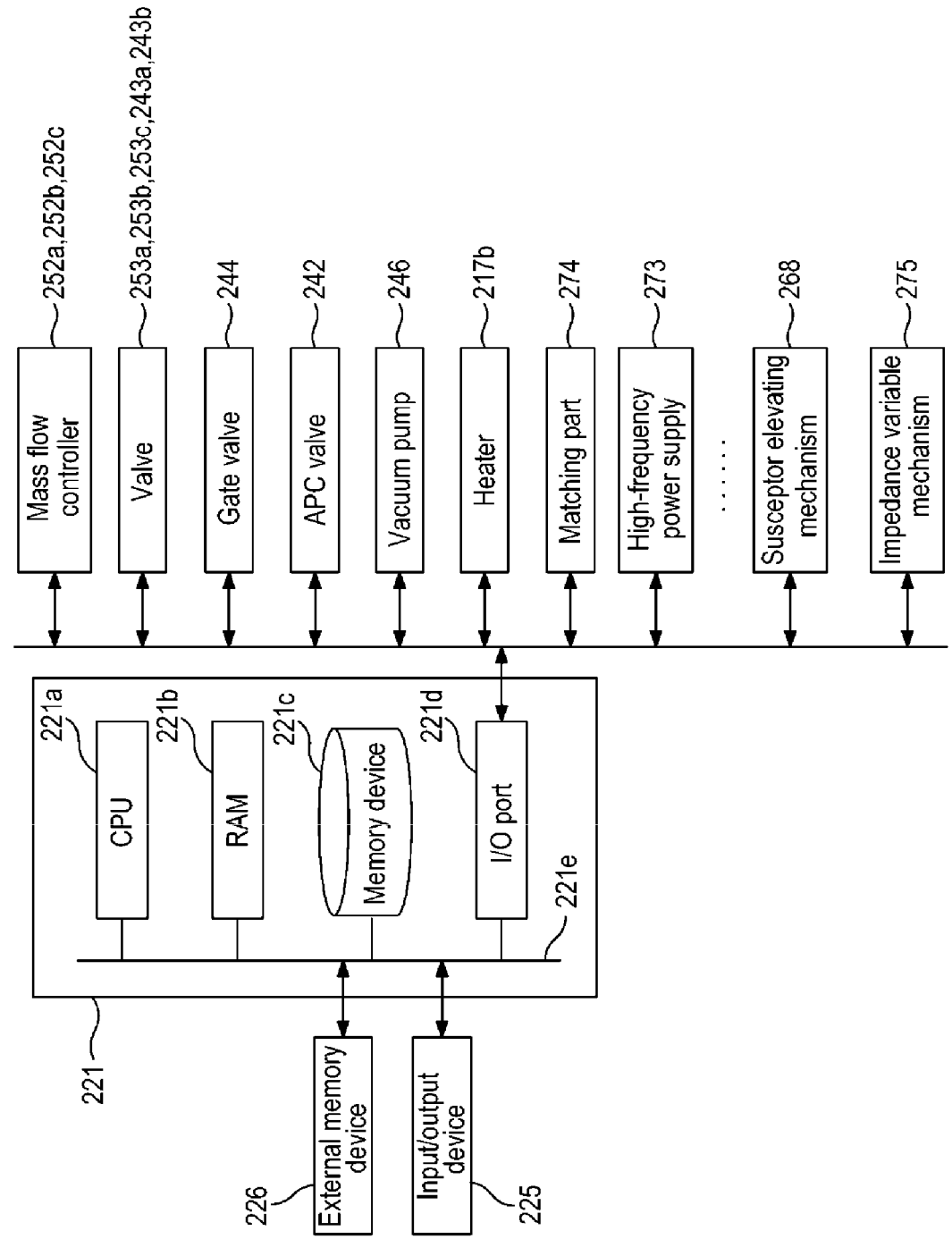

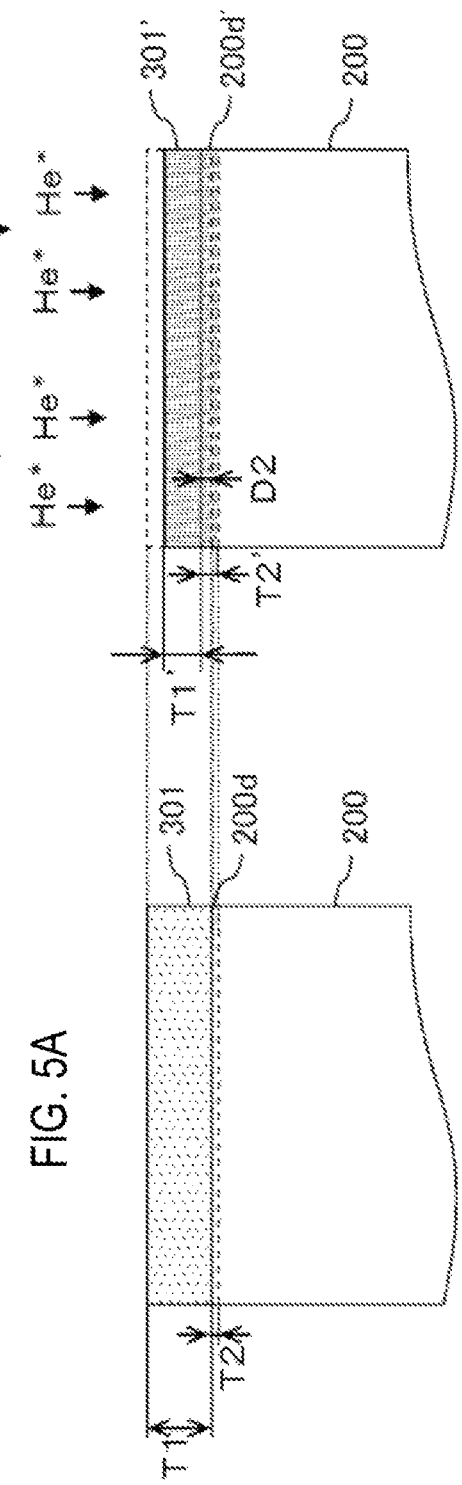

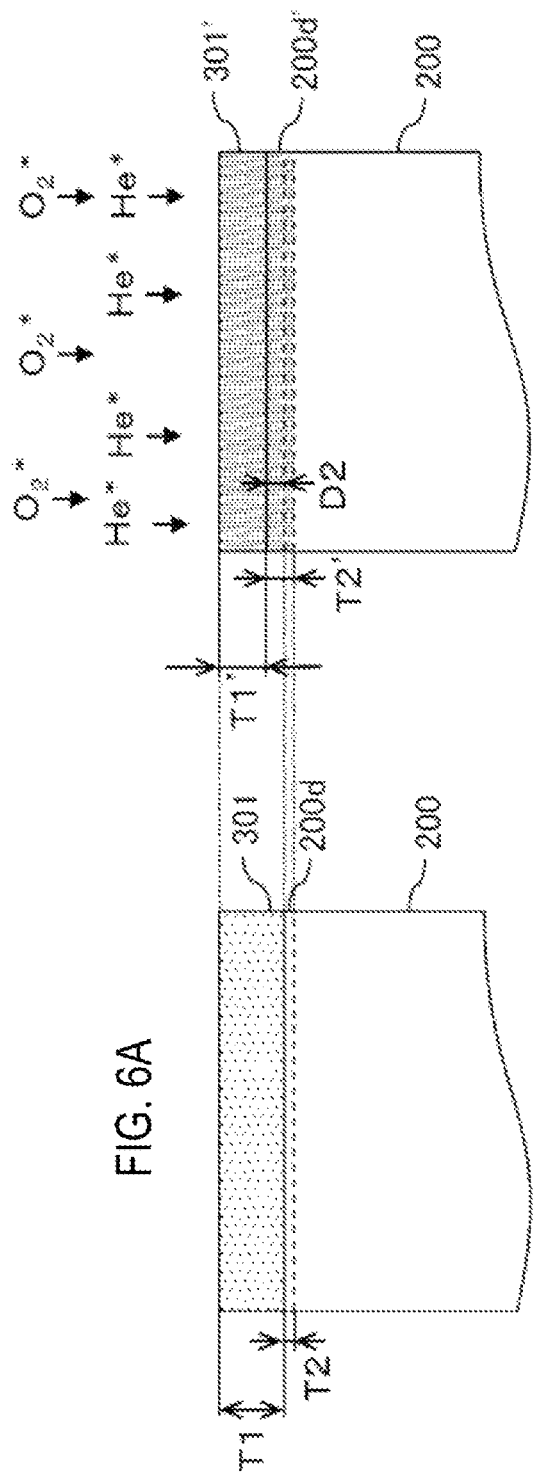

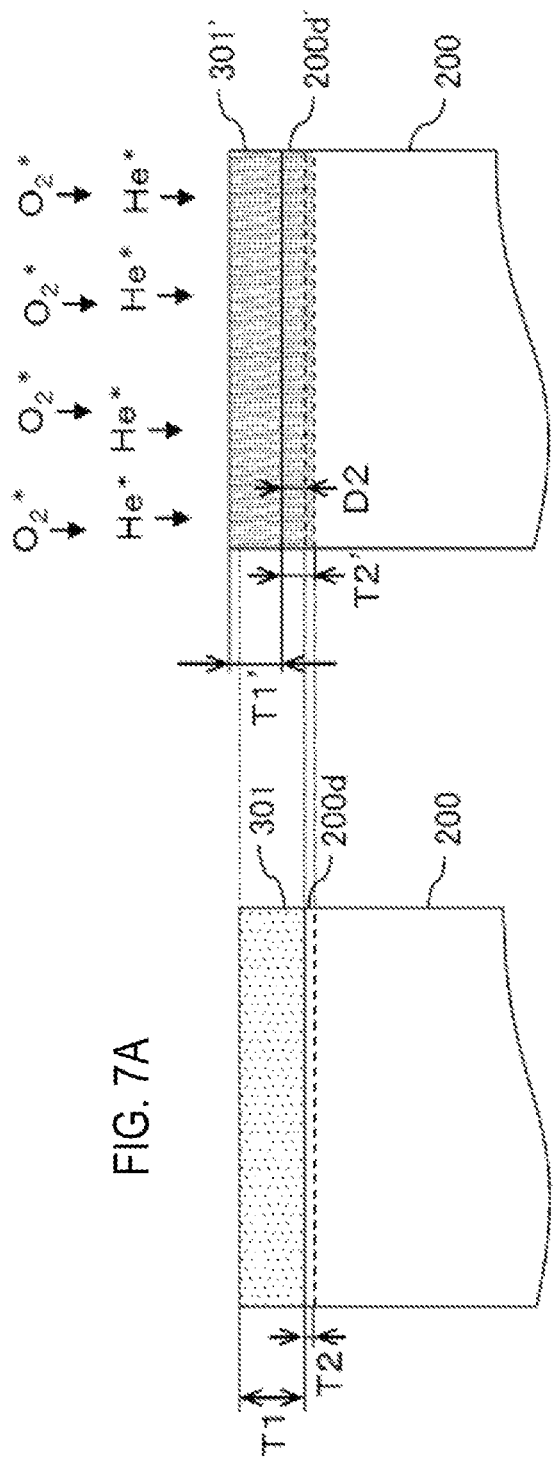

METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2018-177863, filed on Sep. 21, 2018, the entire contents of which are incorporated herein by reference.

TECHNICAL FIELD

The present disclosure relates to a method of manufacturing a semiconductor device, and a recording medium.

BACKGROUND

As a process for manufacturing a semiconductor device, a process of modifying a film formed over a substrate using plasma may be performed in the related art.

SUMMARY

Some embodiments of the present disclosure provide a technique capable of, when a film formed on a substrate is modified using plasma, adjusting a quality of the film over a wide range in a thickness direction of the film.

According to one embodiment of the present disclosure, there is provided a technique that includes: (a) loading a substrate including a base and a first film containing silicon and formed on the base into a process container; (b) converting a modifying gas containing helium into plasma to generate reactive species of helium; and (c) supplying the modifying gas containing the reactive species of helium to a surface of the substrate to respectively modify the first film and an interface layer of the base constituting an interface with the first film.

BRIEF DESCRIPTION OF DRAWINGS

FIG. 2 is a view illustrating a plasma generation principle in an embodiment of the present disclosure.

FIG. 3 is a schematic configuration view of a controller 221 of the substrate processing apparatus 100 suitably used in an embodiment of the present disclosure, in which a control system of the controller 221 is shown in a block diagram.

FIG. 5A is a view illustrating a cross-sectional configuration of a wafer 200 before a modifying process, and FIG. 5B is a view illustrating a cross-sectional configuration of the wafer 200 after the modifying process.

FIG. 6A is a view illustrating a cross-sectional configuration of a wafer 200 before a modifying process, and FIG. 6B is a view illustrating a cross-sectional configuration of the wafer 200 after the modifying process.

FIG. 7A is a view illustrating a cross-sectional configuration of a wafer 200 before a modifying process, and FIG. 7B is a view illustrating a cross-sectional configuration of the wafer 200 after the modifying process.

DETAILED DESCRIPTION

Figure 1:
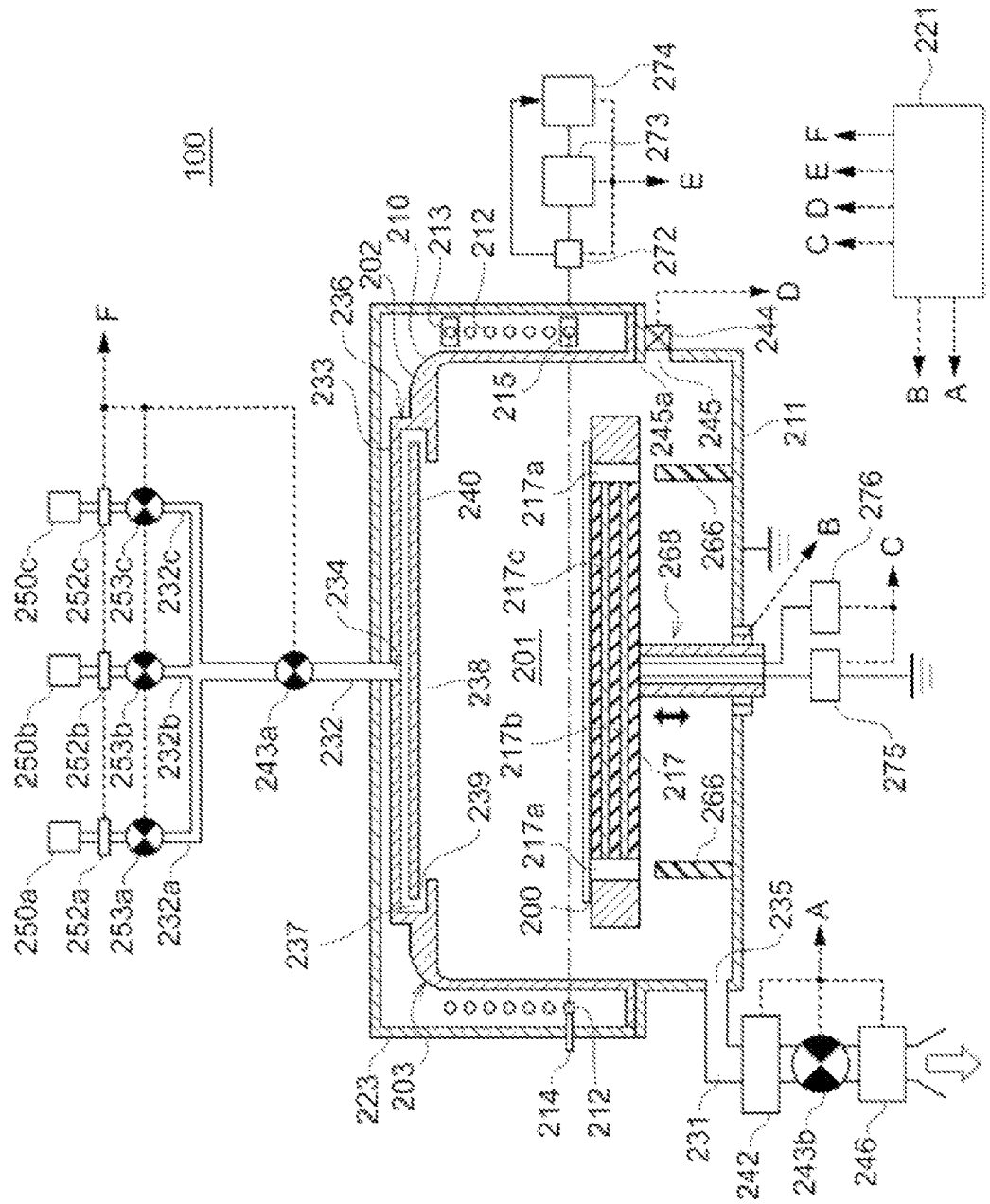
FIG. 1 is a schematic configuration view of a substrate processing apparatus 100 suitably used in an embodiment of the present disclosure, in which a portion of a process furnace 202 is shown in a vertical sectional view.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

An Embodiment of the Present Disclosure

Hereinafter, one embodiment of the present disclosure will be described with reference to FIGS. 1 to 3.
(1) Substrate Processing Apparatus As shown in FIG. 1, a substrate processing apparatus 100 includes a process furnace 202 which accommodates a wafer 200 as a substrate and processes the wafer 200 with plasma. The process furnace 202 includes a process container 203 that constitutes a process chamber 201. The process container 203 includes a dome-shaped upper container 210 and a bowl-shaped lower container 211. The process chamber 201 is formed by covering the upper container 210 on the lower container 211.

On the lower side wall of the lower container 211, a gate valve 244 is installed as a loading/unloading valve (partitioning valve). By opening the gate valve 244, the wafer 200 can be loaded into or unloaded from the process chamber 201 through a loading/unloading port 245. By closing the gate valve 244, an airtightness in the process chamber 201 can be maintained.

As shown in FIG. 2, the process chamber 201 includes a plasma generation space 201a and a substrate processing space 201b kept in communication with the plasma generation space 201a and configured to process the wafer 200 therein. A resonance coil 212 to be described later is installed around the plasma generation space 201a and on the outer peripheral side of the process container 203. The plasma generation space 201a is a space in which plasma is generated. The plasma generation space 201a refers to, for example, a space on the upper side of the lower end of the resonance coil 212 (indicated by a one-dot chain line in FIG. 1) in the process chamber 201. On the other hand, the substrate processing space 201b is a space in which the wafer 200 is processed by plasma. The substrate processing space 201b refers to a space on the lower side of the lower end of the resonance coil 212.

At the bottom center of the process chamber 201, a susceptor 217 as a substrate mounting part is disposed. A substrate mounting surface 217d on which the wafer 200 is mounted is provided on the top surface of the susceptor 217. Inside the susceptor 217, a heater 217b as a heating mechanism is embedded. By supplying electric power to the heater 217b via a heater power adjustment mechanism 276, the wafer 200 mounted on the substrate mounting surface 217d can be heated to a predetermined temperature falling within a range of, for example, 25 to 1000 degrees C.

The susceptor 217 is electrically insulated from the lower container 211. An impedance adjustment electrode 217c is installed inside the susceptor 217. The impedance adjustment electrode 217c is grounded via an impedance variable mechanism 275 as an impedance adjustment part. The variable impedance mechanism 275 includes a coil, a variable capacitor, and the like. The variable impedance mechanism 275 is configured to change an impedance of the impedance adjustment electrode 217c within a predetermined range from about 0Ω to a parasitic impedance value of the process chamber 201 by controlling a resistance, an inductance of the coil, a capacitance value of the variable capacitor, and the like. This makes it possible to control the potential (bias voltage) of the wafer 200 during plasma processing through the impedance adjustment electrode 217c and the susceptor 217.

Below the susceptor 217, a susceptor elevating mechanism 268 for raising and lowering the susceptor 217 is installed. The susceptor 217 is provided with three through-holes 217a. On the bottom surface of the lower container 211, three support pins 266 as support bodies for supporting the wafer 200 are installed so as to correspond to the three through-holes 217a respectively. When the susceptor 217 is lowered, tips of the three support pins 266 penetrate the corresponding through-holes 217a and protrude to the upper surface side of the substrate mounting surface 217d of the susceptor 217 respectively. Thus, the wafer 200 can be held from below.

A gas supply head 236 is installed above the process chamber 201, i.e., above the upper container 210. The gas supply head 236 includes a cap-like lid 233, a gas inlet 234, a buffer chamber 237, an opening 238, a shielding plate 240 and a gas outlet 239. The gas supply head 236 is configured to supply gases into the process chamber 201. The buffer chamber 237 functions as a dispersion space for dispersing the gases introduced from the gas inlet 234.

A downstream end of a gas supply pipe 232a for supplying a modifying gas containing a rare gas such as helium (He), a downstream end of a gas supply pipe 232b for supplying an oxygen (O)-containing gas such as an oxygen gas ($O_2$), and a gas supply pipe 232c for supplying a nitrogen (N)-containing gas such as a nitrogen gas ($N_2$) are connected to the gas inlet 234 so as to be merged. In the gas supply pipe 232a, a modifying gas supply source 250a, a mass flow controller (MFC) 252a as a flow rate control device and a valve 253a as an opening/closing valve are installed sequentially from the upstream side of a gas flow. In the gas supply pipe 232b, an O-containing gas supply source 250b, an MFC 252b, and a valve 253b are installed sequentially from the upstream side of a gas flow. In the gas supply pipe 232c, an N-containing gas supply source 250c, an MFC 252c, and a valve 253c are installed sequentially from the upstream side of a gas flow. A valve 243a is installed on the downstream side of a point where the gas supply pipes 232a to 232c are merged. By opening or closing the valves 253a to 253c and 243a, it is possible to supply the modifying gas, the O-containing gas and the N-containing gas into the process chamber 201 while adjusting the flow rates of the respective gases by the MFCs 252a to 252c.

The modifying gas is converted into plasma and supplied to the wafer 200 in a substrate processing step to be described later. The modifying gas acts to modify at least a part of a film formed on the wafer 200 and a base of the film. In addition, the O-containing gas may be added to the modifying gas and converted into plasma in a substrate processing step to be described later. The O-containing gas may act as an oxidant. Moreover, the N-containing gas may be added to the modifying gas and converted into plasma in a substrate processing step to be described later. The N-containing gas may act as a nitriding agent in the substrate processing step. An $N_2$ gas, which is one kind of the N-containing gas, may be used without being converted into plasma in the substrate processing step to be described later. The $N_2$ gas may act as a purge gas, a carrier gas, or the like.

A modifying gas supply system is mainly constituted by the gas supply head 236 (the lid 233, the gas inlet 234, the buffer chamber 237, the opening 238, the shielding plate 240 and the gas outlet 239), the gas supply pipe 232a, the MFC 252a, and the valves 253a and 243a. Furthermore, an O-containing gas supply system (oxidant supply system) is mainly constituted by the gas supply head 236, the gas supply pipe 232b, the MFC 252b and the valves 253b and 243a. In addition, an N-containing gas supply system (a nitriding agent supply system or an inert gas supply system) is mainly constituted by the gas supply head 236, the gas supply pipe 232c, the MFC 252c and the valves 253c and 243a.

An exhaust port 235 for evacuating the inside of the process chamber 201 is installed on the side wall of the lower container 211. The upstream end of an exhaust pipe 231 is connected to the exhaust port 235. In the exhaust pipe 231, an APC (Auto Pressure Controller) valve 242 as a pressure regulator (pressure regulation part), a valve 243b and a vacuum pump 246 as a vacuum evacuation device are installed sequentially from the upstream side.

An exhaust part is mainly constituted by the exhaust port 235, the exhaust pipe 231, the APC valve 242 and the valve 243b. The vacuum pump 246 may be included in the exhaust part.

A helical resonance coil 212 is installed on the outer periphery of the process chamber 201, i.e., on the outer side of the side wall of the upper container 210 so as to surround the process chamber 201. An RF (Radio Frequency) sensor 272, a high-frequency power supply 273 and a frequency matching device (frequency control part) 274 are connected to the resonance coil 212. A shielding plate 223 is installed on the outer peripheral side of the resonance coil 212.

The high-frequency power supply 273 is configured to supply high-frequency power to the resonance coil 212. The RF sensor 272 is installed on the output side of the high-frequency power supply 273. The RF sensor 272 is configured to monitor information on a traveling wave or a reflected wave of the high-frequency power supplied from the high-frequency power supply 273. The frequency matching device 274 is configured to match the frequency of the high-frequency power outputted from the high-frequency power source 273 so as to minimize the reflected wave, based on the information on the reflected wave monitored by the RF sensor 272.

Both ends of the resonance coil 212 are electrically grounded. One end of the resonance coil 212 is grounded via a movable tap 213. The other end of the resonance coil 212 is grounded via a fixed ground 214. A movable tap 215 is installed between the two ends of the resonance coil 212. The movable tap 215 can arbitrarily set a position to which power is supplied from the high-frequency power supply 273. With these configurations, when the substrate processing apparatus 100 is initially installed or when the processing conditions are changed, it is possible to finely adjust an electrical length or an impedance of the resonance coil 212, and it is possible to easily make resonance characteristics approximately equal to those of the high-frequency power supply 273.

The shielding plate 223 is configured to shield the leakage of electromagnetic waves to the outside of the resonance coil 212 and to form a capacitive component necessary to constitute a resonant circuit between the shielding plate 223 and the resonance coil 212.

A plasma generation part is mainly constituted by the resonance coil 212, the RF sensor 272 and the frequency matching device 274. The high-frequency power supply 273 and the shielding plate 223 may be included in the plasma generation part.

Hereinafter, an operation of the plasma generation part and the properties of the generated plasma will be additionally described with reference to FIG. 2.

The resonance coil 212 is configured to function as a high-frequency inductively-coupled plasma (ICP) electrode. The resonance coil 212 forms a standing wave of a predetermined wavelength. A winding diameter, a winding pitch, and the number of turns and the like of the resonance coil 212 are set so as to resonate in all wavelength modes. An electrical length of the resonance coil 212, i.e., an electrode length between the grounds is adjusted to be an integer multiple of the wavelength of the high-frequency power supplied from the high-frequency power supply 273. The configurations described above, an electric power supplied to the resonance coil 212, a magnetic field strength generated by the resonance coil 212, and the like are appropriately determined in consideration of an external shape of the substrate processing apparatus 100, processing contents, and the like. As an example, an effective cross-sectional area of the resonance coil 212 is 50 to 300 mm$^2$, a coil diameter is 200 to 500 mm, and the number of turns of the coil is 2 to 60. The magnitude of the high-frequency power supplied to the resonance coil 212 is 0.5 to 5 kW, or may be 1.0 to 4.0 kW in some embodiments, and the frequency is 800 kHz to 50 MHz. The magnetic field generated by the resonance coil 212 is 0.01 to 10 gauss.

The high-frequency power supply 273 includes a power supply control means and an amplifier. The power supply control means is configured to output a predetermined high-frequency signal (control signal) to the amplifier based on an output condition regarding electric power or frequency set in advance through an operation panel. The amplifier is configured to output the high-frequency power obtained by amplifying the control signal received from the power supply control means toward the resonance coil 212 via a transmission line. As described above, the RF sensor 272 that detects the reflected wave power in the transmission line and feeds back a voltage signal thereof to the frequency matching device 274 is installed on the output side of the amplifier.

The frequency matching device 274 receives a voltage signal regarding the reflected wave power from the RF sensor 272, and performs correction control to increase or decrease the frequency (oscillation frequency) of the high-frequency power outputted from the high-frequency power supply 273 so that the reflected wave power is minimized. The correction of the oscillation frequency is performed using a frequency control circuit provided in the frequency matching device 274. The frequency control circuit is configured to oscillate at the no-load resonance frequency of the resonance coil 212 before ignition of plasma and to oscillate at a predetermined frequency (a frequency set by increasing or decreasing the no-load resonance frequency) so as to minimize the reflected wave power after ignition of plasma. The frequency control circuit feeds back a control signal including the corrected frequency to the high-frequency power supply 273. The high-frequency power supply 273 corrects the frequency of the high-frequency power based on the control signal. The frequency of the high-frequency power is optimized to a resonance frequency at which the reflected wave power in the transmission line becomes zero.

With the above configuration, induction plasma excited in the plasma generation space 201a has a good quality with almost no capacitive coupling with an inner wall of the process chamber 201, the susceptor 217, and the like. In the plasma generation space 201a, there is generated plasma having a very low electric potential and having a donut shape in a plane view.

As illustrated in FIG. 3, the controller 221 as a control part is configured as a computer including a central processing unit (CPU) 221a, a random access memory (RAM) 221b, a memory device 221c and an I/O port 221d. The RAM 221b, the memory device 221c and the I/O port 221d are configured to be able to exchange data with the CPU 221a via an internal bus 221e. An input/output device 225, for example, a touch panel, a mouse, a keyboard, an operation terminal or the like may be connected to the controller 221. A display part, for example, a display or the like may be connected to the controller 221.

The memory device 221c is constituted by, for example, a flash memory, a hard disk drive (HDD), a CD-ROM, or the like. A control program for controlling the operation of the substrate processing apparatus 100, a process recipe in which the procedures or conditions of a substrate processing process and the like are written, and the like are readably stored in the memory device 221c. The process recipe, which is combined to cause the controller 221 to execute each procedure in the substrate processing process to be described below so as to obtain a predetermined result, functions as a program. The RAM 221b is configured as a memory area (work area) in which a program or data read by the CPU 221a is temporarily held.

The I/O port 221d is connected to the MFCs 252a, 252b and 252c, the valves 253a, 253b, 253c, 243a and 243b, the gate valve 244, the APC valve 242, the vacuum pump 246, the heater 217b, the RF sensor 272, the high-frequency power supply 273, the frequency matching device 274, the susceptor elevating mechanism 268, the impedance variable mechanism 275, and the like.

The CPU 221a is configured to read out and execute a control program from the memory device 221c and to read out a process recipe from the memory device 221c in response to an input of an operation command from the input/output device 225 or the like. As shown in FIG. 1, the CPU 221a is configured to, according to the contents of the process recipe thus read, control the opening degree adjustment operation of the APC valve 242, the opening/closing operation of the valve 243b and the start and stop of the vacuum pump 246 via the I/O port 221d and a signal line A, control the elevating operation of the susceptor elevating mechanism 268 via a signal line B, control the adjustment operation of the amount of electric power supplied to the heater 217b (temperature adjustment operation) based on the temperature sensor by the heater power adjustment mechanism 276 and the impedance value adjustment operation by the impedance variable mechanism 275 via a signal line C, control the opening/closing operation of the gate valve 244 via a signal line D, control the operations of the RF sensor 272, the frequency matching device 274 and the high-frequency power supply 273 via a signal line E, and control the flow rate adjustment operation of various gases by MFCs 252a, 252b and 252c and the opening/closing operations of valves 253a, 253b, 253c and 243a via a signal line F, respectively.

(2) Substrate Processing Process

Figure 4B:
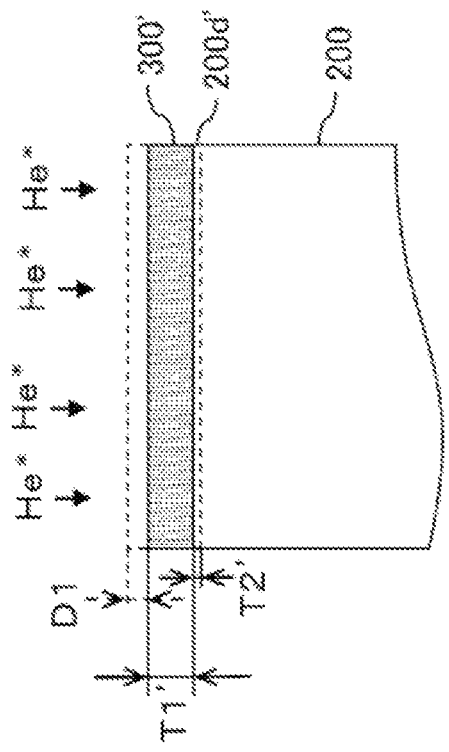
FIG. 4B is a view illustrating a cross-sectional configuration of the wafer 200 after the modifying process.

As one step of processes of manufacturing a semiconductor device using the above-described substrate processing apparatus 100, an example of a substrate processing sequence in which a film formed on a wafer 200 as a substrate is modified using plasma will be described mainly with reference to FIGS. 4A and 4B. In the following description, the operation of each part constituting the substrate processing apparatus 100 is controlled by the controller 221.

The substrate processing sequence of the present embodiment includes: step A of loading a wafer 200 having a base and a first film formed on the base and containing silicon (Si) into the process container 203; step B of converting a modifying gas containing helium (He) into plasma to generate reactive species of He; and step C of supplying the modifying gas containing the reactive species of He to the surface of the wafer 200 to modify the first film and an interface layer of the base constituting an interface with the first film.

In this embodiment, description will be made on a case where the wafer 200 is made of a single crystal of Si and the first film is formed directly on the surface of the wafer 200, i.e., a case where the base of the first film is made of Si crystal. Further, description will be made on a case where the first film to be modified is a film containing Si and O, i.e., a silicon oxide film (SiO film). In addition, description will be made on a case where a He gas alone is used as the modifying gas.

In this specification, a SiO film before modification is denoted by reference numeral 300 and a SiO film after modification is denoted by reference numeral 300' to distinguish them. Furthermore, an interface layer before modification is denoted by reference numeral 200d and an interface layer after modification is denoted by reference numeral 200d' to distinguish them. The interface layer 200d referred to herein is a part of the base of the SiO film 300 (the surface of the wafer 200) and is a portion of the surface layer of the wafer 200 that constitutes the interface with the SiO film 300. The reactive species of He reach the interface layer 200d through the SiO film 300 in a modifying process of step C described later.

When the term "wafer" is used herein, it may refer to a wafer itself or a laminated body of a wafer and a predetermined layer or film formed on the surface of the wafer. Furthermore, when the phrase "a surface of a wafer" is used herein, it may refer to a surface of a wafer itself or a surface of a predetermined layer or the like formed on a wafer. Moreover, the expression "a predetermined layer is formed on a wafer" as used herein may mean that a predetermined layer is directly formed on a surface of a wafer itself or that a predetermined layer is formed on a layer or the like formed on a wafer. When the term "substrate" is used herein, it may be synonymous with the term "wafer."

(Wafer Loading)

With the susceptor 217 lowered to a predetermined transfer position, the gate valve 244 is opened, and the wafer 200 to be processed is loaded into the process chamber 201 by a transfer robot not shown (step A). The wafer 200 loaded into the process chamber 201 is supported in a horizontal posture on the three support pins 266 protruding upward from the substrate mounting surface 217d of the susceptor 217. After the loading of the wafer 200 into the process chamber 201 is completed, an arm portion of the transfer robot is retracted from the process chamber 201, and the gate valve 244 is closed. Thereafter, the susceptor 217 is raised to a predetermined processing position, and the wafer 200 to be processed is transferred onto the susceptor 217 from the support pins 266.

Figure 4A:
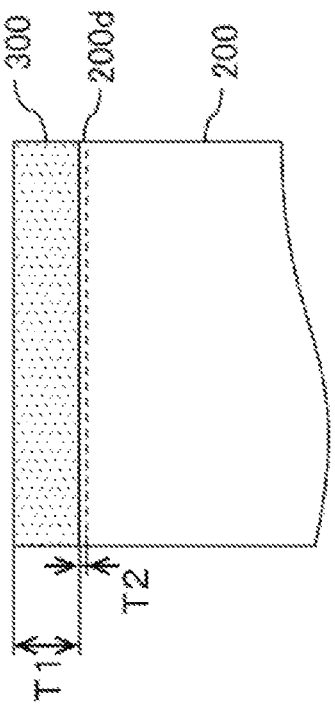
FIG. 4A is a view illustrating a cross-sectional configuration of a wafer 200 before a modifying process.

As shown in FIG. 4A, a SiO film 300, which is a film to be modified, is formed in advance on the wafer 200 to be processed. The SiO film 300 is formed by depositing SiO on the wafer 200 under a relatively low temperature condition, e.g., a temperature condition falling within a range of room temperature to 600 degrees C., or 100 to 500 degrees C. in some embodiments, using a method such as, for example, a CVD method or an ALD method.

Since the SiO film 300 is formed under the relatively low temperature condition as described above, there is a tendency that the SiO film 300 contains a large amount of impurities and has a low film density, as compared with a SiO film formed under a higher temperature condition than the aforementioned temperature condition. The impurities tend to contain, for example, at least one selected from the group consisting of hydrogen (H), oxygen (O), water ($H_2O$), carbon (C), nitrogen (N), phosphorus (P), sulfur (S), fluorine (F) and chlorine (Cl).

The film density of the SiO film is a density that allows the action of the modifying process in step C to be described later to spread over the entire thickness direction of the film, and is a density that allows the reactive species of He used in the modifying process to reach the interface layer 200d of the base of the SiO film 300 (the surface of the wafer 200) constituting the interface with the SiO film 300. The film density of the SiO film 300 before modification is, for example, a predetermined density of 3.00 $g/cm^3$ or less, or 2.50 $g/cm^3$ or less in some embodiments, and is 2.26 $g/cm^3$ in the present embodiment. If the film density before modification exceeds 3.00 $g/cm^3$, the probability that the reactive species of He reach the base of the SiO film 300 decreases. This makes it difficult to sufficiently spread the action of the modifying process to the base. If the SiO film 300 exists so as to have an interface with the base, the modifying process of the present embodiment may be applied, and the density of the SiO film 300 may be, for example, 1 $g/cm^3$ or more.

The thickness of the SiO film 300 is a thickness that allows the action of the modifying process in step C to be described later to spread over the entire thickness direction of the film, and is a thickness that allows the reactive species of He used in the modifying process to reach the interface layer 200d of the base of the SiO film 300 (the surface of the wafer 200) constituting the interface with the SiO film 300. The thickness of the SiO film 300 before modification is, for example, a predetermined thickness of 10 nm or less, or 7 nm or less in some embodiments, and is 3 nm in the present embodiment. If the thickness of the SiO film 300 before modification exceeds 10 nm, the probability that the reactive species of He reach the base of the SiO film 300 decreases. This makes it difficult to sufficiently spread the action of the modifying process to the base. If the SiO film 300 exists so as to have an interface with the base, the modifying process of the present embodiment may be applied, and the thickness of the SiO film 300 may be, for example, 1 nm or more.

(Pressure Regulation/Temperature Adjustment)

Subsequently, the inside of the process chamber 201 is vacuum-evacuated by the vacuum pump 246 so that the inside of the process chamber 201 has a desired processing pressure. The pressure in the process chamber 201 is measured by a pressure sensor, and the APC valve 242 is feedback-controlled based on the measured pressure information. Furthermore, the wafer 200 is heated by the heater 217b so as to reach a desired processing temperature. When the inside of the process chamber 201 reaches a desired processing pressure and when the temperature of the wafer 200 reaches a desired processing temperature and becomes stable, a modifying process described later is started.
(Modifying Process)

In this process, first, a He gas as a modifying gas is converted into plasma to generate reactive species of He (step B). Specifically, the valves 253a and 243a are opened, and the He gas is supplied into the process chamber 201 through the buffer chamber 237 while controlling the flow rate with the MFC 252a. At this time, high-frequency power is supplied to the resonance coil 212 from the high-frequency power supply 273. Thus, induction plasma having a donut shape in plane view is excited at a height position corresponding to an electrical midpoint of the resonance coil 212 in the plasma generation space 201a. The excitation of the induction plasma activates the He gas to generate reactive species of He. The reactive species of He include at least one of excited He atoms (He*) and ionized He atoms.

By performing step B, the He gas containing reactive species of He is supplied to the surface of the wafer 200. Since He is an element having a very small atomic radius, reactive species of He deeply intrude (penetrate) into the interior of the SiO film 300 formed on the wafer 200 and go to every corner of the SiO film 300 throughout the thickness direction of the SiO film 300. Further, the reactive species of He spread over the entire thickness direction of the SiO film 300, and reach the interface layer 200d of the base of the SiO film 300 (the surface of the wafer 200) constituting the interface with the SiO film 300. As a result, it becomes possible to modify the SiO film 300 formed on the surface of the wafer 200 and the interface layer 200d constituting the interface with the SiO film 300 (step C). As described above, the modifying process of the present embodiment acts not only on the surface of the SiO film 300 but also on the interface layer 200d of the base of the SiO film 300 constituting the interface with the SiO film 300 throughout the thickness direction of the SiO film 300.

Processing conditions in steps B and C may be illustrated as follows:
He gas supply flow rate: 10 to 5000 sccm, or 100 to 1000 sccm in some embodiments, for example 150 sccm
He gas supply time: 0.2 to 60 minutes, or 0.5 to 10 minutes in some embodiments, for example 1 minute
High-frequency power: 100 to 5000 W, or 500 to 3500 W in some embodiments, for example 1500 W
Processing temperature: room temperature to 1000 degrees C., or 600 to 900 degrees C. in some embodiments, for example 700 degrees C.
Processing pressure: 1 to 250 Pa, or 50 to 150 Pa in some embodiments, for example 100 Pa. The notation of the numerical range such as "10 to 5000 sccm" in the present disclosure means "10 sccm or more and 5000 sccm or less." The same applies to other numerical ranges.

In step C, at least one impurity selected from the group consisting of H, O, $H_2O$, C, N, P, S, F and Cl may be desorbed from the SiO film 300 and may be exhausted from the exhaust pipe 231. That is, the aforementioned impurity contained in the SiO film 300 may be removed from the SiO film 300. Since the reactive species of He also reach the interface layer 200d, when the aforementioned impurity is contained in the interface layer 200d, the above-described impurity may be desorbed from the interface layer 200d. The SiO film 300' after modification is a high quality film having an impurity content lower than that of the of the SiO film 300 before modification, and the interface layer 200d' after modification is a high-quality layer having an impurity content equal to or lower than that of the interface layer 200d before modification.

Furthermore, by performing step C, the film density of the SiO film 300 may be increased, and the film may be made dense. As a result, it is possible to reduce the thickness of the SiO film 300' after modification to a thickness less than the thickness of the SiO film 300 before modification. In the following description, it is assumed that the thickness of the SiO film 300 before modification is T1 and the thickness of the SiO film 300' after modification is T1'. In addition, it is assumed that the thickness of the interface layer before modification is T2 and the thickness of the interface layer 200d' after modification is T2'.

As described above, T1' is smaller than T1. The reduction amount of the thickness of the SiO film, which is the difference between them, is expressed as D1 (=T1−T1'). When an He gas alone is used as the modifying gas, there is almost no change between the thickness T2 of the interface layer 200d before modification and the thickness T2' of the interface layer 200d' after modification (T2≈T2'). Thus, there is a tendency that a total thickness (T1'+T2') of the SiO film 300' after modification and the interface layer 200d' after modification becomes smaller than a total thickness of (T1+T2) of the SiO film 300 before modification and the interface layer 200d before modification (T1'+T2'<T1+T2).
(After-Purge and Atmospheric Pressure Restoration)

After the above-described modifying process is completed, the supply of the He gas into the process chamber 201 is stopped, and the supply of the high-frequency power to the resonance coil 212 is stopped. Then, the valve 253c is opened, the $N_2$ gas is supplied into the process chamber 201, and the $N_2$ gas is exhausted from the exhaust pipe 231. Thus, the inside of the process chamber 201 is purged, and the gas and reaction byproducts remaining in the process chamber 201 are removed from the inside of the process chamber 201. Thereafter, the atmosphere in the process chamber 201 is replaced by the $N_2$ gas, and the pressure in the process chamber 201 is returned to the atmospheric pressure.
(Wafer Unloading)

Subsequently, the susceptor 217 is lowered to a predetermined transfer position, and the wafer 200 is transferred from the susceptor 217 onto the support pins 266. Thereafter, the gate valve 244 is opened, and the processed wafer 200 is unloaded from the process chamber 201 using the transfer robot (not shown). Thus, the substrate processing process according to the present embodiment is completed.
(3) Effects of the Present Embodiment According to the present embodiment, one or more of the following effects may be obtained.

(a) By performing step C, the aforementioned impurity contained in the SiO film 300 can be removed from the film. In addition, it is also possible to make the SiO film 300' after modification denser than the SiO film 300 before modification. As a result, the wet etching resistance of the SiO film 300' after modification may be made higher than the wet etching resistance of the SiO film 300 before modification.

(b) By using, as the modifying gas, a gas containing a rare gas which is unlikely to remain in the film after modification and which has an inert property, even when the SiO film 300 to be processed and the underlying interface layer 200d are modified simultaneously as in the present embodiment, the aforementioned modification effects can be surely given over the entire thickness direction of the SiO film 300 while controlling a composition change of the interface layer 200d. That is, in the present embodiment, the modification is permitted even for the interface layer 200d. Therefore, it is possible to modify the entire region in the thickness direction of the SiO film 300. Accordingly, the present embodiment is particularly suitable in the case where the thickness of the SiO film 300 to be processed is small and the film density thereof is small.

(c) In particular, since the rare gas is used alone as the modifying gas, i.e., since the rare gas containing neither an oxidant nor a nitriding agent is used as the modifying gas, the aforementioned modification effects may be surely given over the entire thickness direction of the SiO film 300 while preventing the composition change of each of the SiO film 300 and the interface layer 200*d*, which may be caused by performing step C. Thus, a total thickness of the SiO film 300' after modification and the interface layer 200*d'* after modification can be reduced to a thickness equal to or smaller than a total thickness of the SiO film 300 before modification and the interface layer 200*d* before modification.

(d) By setting the thickness of the SiO film 300 as the processing target to a predetermined thickness of, for example, 10 nm or less, or 7 nm or less in some embodiments, the aforementioned modification effects can be reliably obtained over the entire region in the thickness direction of the SiO film 300. In addition, it is possible to give the aforementioned modification effects to not only the SiO film 300 but also the interface layer 200*d* constituting an interface with the SiO film 300.

(e) By setting the film density of the SiO film 300 as the processing target to a predetermined value of, for example, 3.00 g/cm$^3$ or less, preferably 2.50 g/cm$^3$ or less, the aforementioned modification effects can be reliably obtained over the entire region in the thickness direction of the SiO film 300. In addition, it is possible to give the aforementioned modification effects to not only the SiO film 300 but also the interface layer 200*d* constituting an interface with the SiO film 300.

(f) By using the He gas, which has a small atomic radius and has extremely high permeability into the film, as the modifying gas, the aforementioned modification effects can be reliably obtained over the entire region in the thickness direction of the SiO film 300. In addition, it is possible to reliably give the aforementioned modification effects to not only the SiO film 300 but also the interface layer 200*d* constituting an interface with the SiO film 300.

(g) The above-described effects can be similarly obtained even when a rare gas other than the He gas, for example, a rare gas such as n Ar gas, a Ne gas, a Xe gas or the like is used as the modifying gas. However, the He gas instead of the rare gas other than the He gas may be used as the modifying gas in some embodiments in that an atomic radius of an element is small and the aforementioned effects can be obtained more reliably. When the rare gas other than the He gas is used as the modifying gas, it is preferable to use this gas in combination with the He gas. That is, it is preferable that the modifying gas includes at least the He gas.

(4) Modifications

The substrate processing sequence in the present embodiment is not limited to the above-described one, and may be changed as in the modifications described below. These modifications may be arbitrarily combined. Unless otherwise stated, the processing procedures and processing conditions in each step of each modification may be the same as the processing procedures and processing conditions in each step of the substrate processing sequence (hereinafter simply referred to as the aforementioned substrate processing sequence) described with reference to FIGS. 4A and 4B.

(Modification 1)

The first film as the modification target formed in advance on the wafer 200 is not limited to the SiO film and may be other films containing Si and elements other than Si. For example, the first film may be a film containing Si and N, i.e., a silicon nitride film (SiN film), and may be a film containing Si, O and N, i.e., a silicon oxynitride film (SiON film). Furthermore, the first film may be a Si film made of Si alone. Also in these cases, the same effects as those of the aforementioned substrate processing sequence can be obtained by using, as the modifying gas, a gas containing a He gas and not containing an oxidant and a nitriding agent.

(Modification 2)

When the first film as the modification target is a SiO film, a gas which contains a rare gas such as a He gas or the like and which further contains an oxidant may be used as the modifying gas. As the oxidant, it may be possible to use an O-containing gas such as, for example, an $O_2$ gas, a nitrous oxide ($N_2O$) gas, a nitrogen monoxide (NO) gas, a nitrogen dioxide ($NO_2$) gas, a steam ($H_2O$) gas, a carbon monoxide (CO) gas, a carbon dioxide ($CO^2$) gas or the like. Hereinafter, as an example, a case where an $O_2$ gas is used as the oxidant and a mixed gas (He gas+$O_2$ gas) containing a He gas and an $O_2$ gas is used as the modifying gas will be described in detail with reference to FIGS. 5A, 5B, 6A, 6B, 7A and 7B.

In the following description, a SiO film before modification is denoted by reference numeral 301 and a SiO film after modification is denoted by reference numeral 301' to distinguish them. Furthermore, as in the aforementioned substrate processing sequence, an interface layer before modification and an interface layer after modification are denoted by reference numeral 200*d* and 200*d'* to distinguish them. Moreover, it is assumed that the thickness of the SiO film 301 before modification is T1 and the thickness of the SiO film 301' after modification is T1'. Also in the present modification, T1' is smaller than T1. The reduction amount of the thickness of the SiO film, which is the difference between them, is denoted as D1 (=T1−T1'). Furthermore, it is assumed that the thickness of the interface layer 200*d* before its composition is changed by the modification is T2, and the thickness of the interface layer 200*d'* after its composition is changed by the modification is T2'. In this modification, T2' becomes larger than T2 due to the change in the composition of the interface layer. The increase amount of thickness of the interface layer, which is the difference between them, is denoted as D2 (=T2'−T2).

In step B of the present modification, the He gas+$O_2$ gas as the modifying gas is converted into plasma to generate reactive species of He and reactive species of O, respectively. Specifically, the valves 253*a*, 253*b* and 243*a* are opened, and the He gas and the $O_2$ gas are supplied into the process chamber 201 through the buffer chamber 237 while controlling the flow rates thereof with the MFCs 252*a* and 252*b*, respectively. At this time, by supplying high-frequency power from the high-frequency power supply 273 to the resonance coil 212, the He gas and the $O_2$ gas are activated by plasma, thereby generating reactive species of He and reactive species of O respectively. The reactive species of O includes at least one of an excited $O_2$ molecule ($O_2$\*), an excited O atom (O\*) and an ionized O atom. The reactive species of O acting as an oxidant may include an $O_2$ molecule which is not in an excited state.

By performing step B, the He gas containing reactive species of He and reactive species of O is supplied to the surface of the wafer 200. These reactive species deeply intrude into the interior of the SiO film 301 formed on the wafer 200 and go to every corner of the SiO film 301 throughout the thickness direction of the SiO film 301. Furthermore, these reactive species spread over the entire region of the SiO film 301, and reach the interface layer 200d of the base of the SiO film 301 (the surface of the wafer 200) constituting the interface with the SiO film 301. As a result, it becomes possible to modify the SiO film 301 formed on the surface of the wafer 200 and the interface layer 200d of the base of the SiO film 301 (the surface of the wafer 200) constituting the interface with the SiO film 301 (step C). This modifying process acts not only on the surface of the SiO film 301 but also on the interface layer 200d of the base of the SiO film 301 constituting the interface with the SiO film 301 throughout the thickness direction of the SiO film 301.

In step C, at least one impurity selected from the group consisting of H, $H_2O$, C, N, P, S, F and Cl may be removed from the SiO film 301. In addition, the SiO film 301 may be made dense. Further, the reactive species of He and the reactive species of O also reach the interface layer 200d. Therefore, when the aforementioned impurity is contained in the interface layer 200d, it is possible to desorb the aforementioned impurity from the interface layer 200d. The SiO film 301' after modification becomes a high quality film having an impurity content lower than that of the SiO film 301 before modification, and the interface layer 200d' after modification becomes a high-quality layer having an impurity content equal to or smaller than that of the interface layer 200d before modification. The SiO film 301' after modification becomes a film having a wet etching resistance higher than that of the SiO film 301 before modification.

In step C, the SiO film 301 formed on the wafer 200 can be oxidized by the action of the reactive species of O contained in the modifying gas. As a result, it becomes possible to control the composition of the SiO film 301' after modification so as to approach a stoichiometric composition of silicon oxide ($SiO_2$). Further, in step C, the interface layer 200d formed of Si single crystal can be oxidized by the action of the reactive species of O contained in the modifying gas. As a result, O can be added to the interface layer 200 d' after modification and its composition can be changed to SiO. That is, it is possible to modify the interface layer 200d configured as a Si layer into the interface layer 200d' configured as a SiO layer. By virtue of these reactions, the thickness T1' of the SiO film 301' after modification tends to be smaller than the thickness T1 of the SiO film before modification. In addition, the thickness T2' of the interface layer 200d' whose composition has been changed by the modification tends to be larger than the thickness T2 of the interface layer before modification.

By appropriately adjusting the processing conditions in steps B and C, it is possible to freely adjust the total thickness of the SiO film 301' after modification and the interface layer 200d' whose composition has been changed by the modification.

For example, as shown in FIGS. 5A and 5B, in step C, the total thickness of the SiO film 301' after modification and the interface layer 200d' whose composition has been changed by the modification can be made smaller than the total thickness of the SiO film 301 before modification and the interface layer 200d whose composition has not been changed by the modification (T1'+T2'<T1+T2). That is, the increase amount D2 of the thickness of the interface layer due to the modification can be made smaller than the decrease amount D1 of the thickness of the SiO film due to the modification.

For example, as shown in FIGS. 6A and 6B, in step C, the total thickness of the SiO film 301' after modification and the interface layer 200d' whose composition has been changed by the modification can be made equal to the total thickness of the SiO film 301 before modification and the interface layer 200d before its composition is changed by the modification (T1'+T2'=T1+T2). That is, the increase amount D2 of the thickness of the interface layer due to the modification can be made equal to the decrease amount D1 of the thickness of the SiO film due to the modification.

For example, as shown in FIGS. 7A and 7B, in step C, the total thickness of the SiO film 301' after modification and the interface layer 200d' whose composition has been changed by the modification can be made larger than the total thickness of the SiO film 301 before modification and the interface layer 200d before its composition is changed by the modification (T1'+T2'>T1+T2). That is, the increase amount D2 of the thickness of the interface layer due to the modification can be made larger than the decrease amount D1 of the thickness of the SiO film due to the modification.

In order to perform these controls, for example, in steps B and C, the ratio of He to O in the modifying gas supplied into the process container 203 may be adjusted. More specifically, for example, a ratio (B/A) of the flow rate B of the $O_2$ gas supplied into the process container 203 to the flow rate A of the He gas supplied into the process container 203 may be adjusted.

For example, by increasing the B/A ratio in steps B and C, the total thickness of the SiO film 301' after modification and the interface layer 200d' whose composition has been changed by the modification may be adjusted to increase. That is, the shape of the cross section of the wafer 200 after modification can be brought from the shape shown in FIG. 5B close to the shape shown in FIG. 6B or FIG. 7B.

Further, for example, by decreasing the B/A ratio in steps B and C, the total thickness of the SiO film 301' after modification and the interface layer 200d' whose composition has been changed by the modification may be adjusted to decrease. That is, the shape of the cross section of the wafer 200 after modification can be brought from the shape shown in FIG. 7B close to the shape shown in FIG. 6B or FIG. 5B.

Processing conditions in steps B may be illustrated as follows:
He gas supply flow rate: 10 to 5000 sccm, or 100 to 1000 sccm in some embodiments, for example 150 sccm
$O_2$ gas supply flow rate: 10 to 5000 sccm, or 100 to 1000 sccm in some embodiments, for example 50 sccm
He gas+$O_2$ gas supply time: 0.5 to 60 minutes, or 0.5 to 10 minutes in some embodiments, for example 1 minute. Other processing conditions are the same as the processing conditions in steps B and C of the aforementioned substrate processing sequence.

(Modification 3)

When the first film as the modification target is a SiN film, a gas containing a rare gas such as a He gas or the like and further containing a nitriding agent may be used as the modifying gas. As the nitriding agent, it may be possible to use, for example, an N-containing gas such as an $N_2$ gas, an ammonia ($NH_3$) gas or the like. Hereinafter, as an example, description will be made on a case where an $N_2$ gas is used as the nitriding agent and a mixed gas (He gas+$N_2$ gas) containing a He gas and an $N_2$ gas is used as the modifying gas.

In step B of the present modification, the He gas+$N_2$ gas as the modifying gas is converted into plasma to generate reactive species of He and reactive species of N, respectively. Specifically, the valves 253a, 253c and 243a are opened, and the He gas and the $N_2$ gas are supplied into the process chamber 201 through the buffer chamber 237 while controlling the flow rates thereof with the MFCs 252a and 252c, respectively. At this time, by supplying high-frequency power from the high-frequency power supply 273 to the resonance coil 212, the He gas and the $N_2$ gas are activated by plasma, thereby generating reactive species of He and reactive species of N respectively. The reactive species of N includes at least one of an excited $N_2$ molecule ($N_2^*$), an excited N atom (N*) and an ionized N atom. The reactive species of N acting as the nitriding agent may include an $N_2$ molecule which is not in an excited state.

By performing step B, the He gas containing the reactive species of He and the reactive species of N is supplied to the surface of the wafer 200. These reactive species deeply intrude into the interior of the SiN film formed on the wafer 200 and go to every corner of the SiN film throughout the thickness direction of the SiN film. Further, these reactive species spread over the entire region of the SiN film, and reach the interface layer of the base of the SiN film (the surface of the wafer) constituting the interface with the SiN film. As a result, it becomes possible to modify the SiN film formed on the surface of the wafer 200 and the interface layer of the base of the SiN film (the surface of the wafer 200) constituting the interface with the SiN film (step C). This modifying process acts not only on the surface of the SiN film but also on the interface layer of the base of the SiN film constituting the interface with the SiN film throughout the thickness direction of the SiN film.

Also in this modification, the same effects as those of Modification 2 may be obtained.

That is, in step C, at least one impurity selected from the group consisting of H, O, $H_2O$, C, P, S, F and Cl may be removed from the SiN film. Therefore, the SiN film after modification becomes a high quality film having an impurity content lower than that of the SiN film before modification, and the interface layer after modification becomes a high-quality layer having an impurity content equal to or smaller than that of the interface layer before modification. The SiN film after modification becomes a film having a wet etching resistance higher than that of the SiN film before modification.

In step C, the SiN film formed on the wafer 200 can be nitrided by the action of the reactive species of N contained in the modifying gas. As a result, it becomes possible to control the composition of the SiN film after modification so as to approach a stoichiometric composition of silicon nitride ($Si_3N_4$). Furthermore, in step C, the interface layer formed of Si single crystal may be nitrided by the action of the reactive species of N contained in the modifying gas. As a result, N may be added to the interface layer after modification and its composition may be changed to SiN. That is, it is possible to modify the interface layer configured as a Si layer into the interface layer configured as a SiN layer. By virtue of these reactions, the thickness of the SiN film after modification tends to be smaller than the thickness of the SiN film before modification. In addition, the thickness of the interface layer whose composition has been changed by the modification tends to be larger than the thickness of the interface layer before modification.

By appropriately adjusting the processing conditions in steps B and C, it is possible to freely adjust the total thickness of the SiN film after modification and the interface layer whose composition has been changed by the modification.

For example, in step C, the total thickness of the SiN film after modification and the interface layer whose composition has been changed by the modification can be made smaller than the total thickness of the SiN film before modification and the interface layer before its composition is changed by the modification. That is, the increase amount of the thickness of the interface layer due to the modification can be made smaller than the decrease amount of the thickness of the SiN film due to the modification.

For example, in step C, the total thickness of the SiN film after modification and the interface layer whose composition has been changed by the modification can be made equal to the total thickness of the SiN film before modification and the interface layer before its composition is changed by the modification. That is, the increase amount of the thickness of the interface layer due to the modification can be made equal to the decrease amount of the thickness of the SiN film due to the modification.

Further, for example, in step C, the total thickness of the SiN film after modification and the interface layer whose composition has been changed by the modification can be made larger than the total thickness of the SiN film before modification and the interface layer before its composition is changed by the modification. That is, the increase amount of the thickness of the interface layer due to the modification can be made larger than the decrease amount of the thickness of the SiN film due to the modification.

In order to perform these controls, as in Modification 2, for example, in steps B and C, the ratio of He to N contained in the modifying gas supplied into the process container 203 may be adjusted. More specifically, for example, the ratio (B/A) of the flow rate B of the $N_2$ gas supplied into the process container 203 to the flow rate A of the He gas supplied into the process container 203 may be adjusted.

For example, by increasing the B/A ratio in steps B and C, the total thickness of the SiN film after modification and the interface layer whose composition has been changed by the modification can be adjusted so as to increase. Further, for example, by reducing the B/A ratio in steps B and C, the total thickness of the SiN film after modification and the interface layer whose composition has been changed by the modification can be adjusted so as to decrease.

Processing conditions in steps B and C may be illustrated as follows:
He gas supply flow rate: 10 to 5000 sccm, or 100 to 1000 sccm in some embodiments, for example 150 sccm
$N_2$ gas supply flow rate: 10 to 5000 sccm, or 100 to 1000 sccm in some embodiments, for example 50 sccm
He gas+$N_2$ gas supply time: 0.2 to 60 minutes, or 0.5 to 10 minutes in some embodiments, for example 1 minute. Other processing conditions are the same as the processing conditions in steps B and C of the aforementioned substrate processing sequence.

(Modification 4)

When the first film as the modification target is a SiON film, a gas containing a rare gas such as a He gas or the like and further containing any one of an oxidant and a nitriding agent, or both of them in some embodiments, may be used as the modifying gas. The processing procedures and processing conditions in steps B and C of the present modification may be the same as the processing procedures and processing conditions in steps B and C of Modifications 2 and 3. Also in the present modification, substantially the same effects as those of Modifications 2 and 3 may be obtained.

Other Embodiments

The embodiment of the present disclosure has been specifically described above. However, the present disclosure is not limited to the above-described embodiment, and various modifications may be made without departing from the spirit of the present disclosure.

For example, in the above-described embodiment, there has been described the example in which the first film is formed directly on the substrate, i.e., the example in which the base of the first film is the surface of the substrate (the example in which the base of the first film is a Si single crystal). However, the present disclosure is not limited to such an embodiment. For example, the base of the first film may be a film formed on a substrate. Examples of this film include a Si film, a SiO film, a SiN film, a SiON film and the like. Even in such a case, by performing the same substrate processing sequence as the above-described embodiments, it is possible to obtain the same effects as those of the above-described embodiments. Further, in Modifications 2 to 4, in particular, the base of the first film may be a film that does not contain or substantially not contain an element other than He (O in Modification 2 and N in Modification 3) contained in the modifying gas in some embodiments. For example, in Modification 2, a Si film, a SiN film or the like is illustrated. In Modification 3, a Si film, a SiO film or the like is illustrated.

For example, in the above-described embodiment, there has been described the example in which the modifying gas is converted into plasma in the process container. However, the present disclosure is not limited to such an embodiment. That is, the modifying gas may be converted into plasma outside the process container, and the modifying gas containing various reactive species thus generated may be supplied to the substrate accommodated in the process container. Even in such a case, the same effects as those of the above-described embodiments may be obtained.

Furthermore, for example, in the above-described embodiment, there have been described the examples in which the process of forming the first film on the substrate and the process of modifying the first film using plasma are performed ex situ in different process chambers. However, these processes may be performed continuously in situ in the same process chamber. Even in such a case, by performing the same substrate processing sequence as those of the above-described embodiments in the modifying process, the same effects as those of the above-described embodiments may be obtained.

The above-described embodiments and modifications may be used in combination as appropriate. The processing procedures and processing conditions at this time may be the same as, for example, the processing procedures and processing conditions of the above-described embodiments.
(Example)

In an Example, a SiO film is formed on a Si wafer using a CVD method. Various conditions such as a temperature condition, a film thickness and a film density of the SiO film are set to predetermined conditions falling within the condition range mentioned in the above-described embodiments. Thereafter, using the substrate processing apparatus shown in FIG. 1, the SiO film formed in advance on the Si wafer is modified with plasma according to the substrate processing sequence shown in the above-described embodiments. He gas+$O_2$ gas is used as the modifying gas. The processing conditions are set to predetermined conditions falling within the processing condition range mentioned in the above-described embodiments. After performing the modifying process, a total thickness of the SiO film after modification and the interface layer of the Si wafer whose composition has been changed by the modification is measured. In addition, an aqueous solution of hydrogen fluoride is supplied to the surface of the SiO film after modification, and a wet etching rate (WER) of the film is measured.

In Comparative Example 1, a SiO film is formed on a Si wafer under the same processing procedures and processing conditions as in the Example. Then, a total thickness of the SiO film formed on the Si wafer and an interface layer of the Si wafer is measured without performing a modifying process using a plasma. Further, an aqueous solution of hydrogen fluoride is supplied to the surface of the SiO film not subjected to a modifying process under the same processing conditions as in the first example. A WER of the film is measured.

In Comparative Example 2, a SiO film is formed on a Si wafer under the same processing procedures and processing conditions as in the examples, and then the SiO film formed on the Si wafer is modified with $O_2$ plasma using the substrate processing apparatus shown in FIG. 1. A modifying gas does not contain a He gas. After performing the modifying process, a total thickness of the SiO film after modification and an interface layer of the Si wafer whose composition has been changed by the modification is measured. In addition, an aqueous solution of hydrogen fluoride is supplied to the surface of the SiO film after modification under the same processing conditions as in the first example. A WER of the film is measured.

Figure 8A:
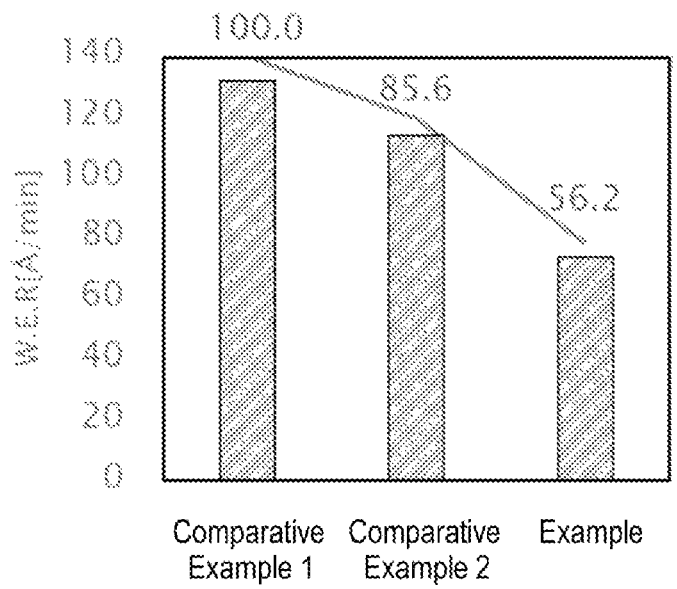
FIG. 8A is a view showing a measurement result of a wet etching resistance of a film formed on a substrate.
Figure 8B:
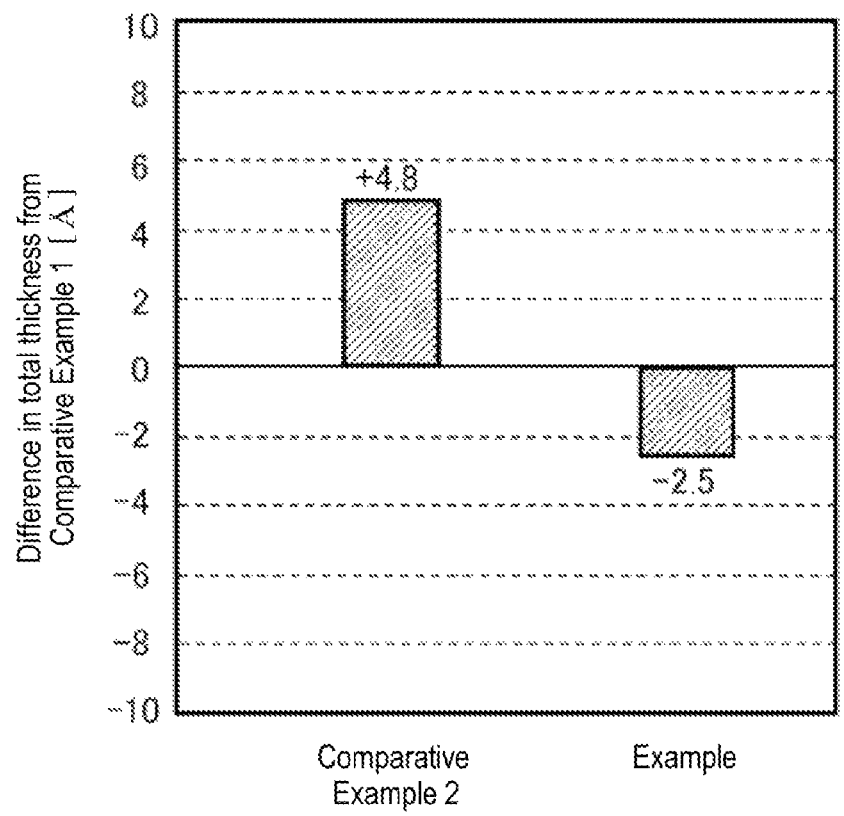
FIG. 8B is a view showing a measurement result of a film thickness of the film formed on the substrate.

FIG. 8A shows measurement results of the etching rate of the SiO film, and FIG. 8B shows measurement results of the total thickness of the SiO film and the interface layer. In FIG. 8A, the vertical axis indicates WER (Å/min), and the horizontal axis indicates Comparative Example 1, Comparative Example 2 and the Example in order. The vertical axis in FIG. 8B indicates a magnitude of the total film thickness based on the total film thickness of Comparative Example 1, and the horizontal axis indicates Comparative Example 2 and the Example in order.

According to FIG. 8A, it can be seen that the WER of the SiO film of the Example is smaller than the WER of the SiO film of Comparative Examples 1 and 2. That is, it can be noted that the SiO film formed on the Si wafer can be modified into a high quality film excellent in etching resistance by performing the modifying process using the substrate processing sequence of the above-described embodiments.

According to FIG. 8B, it can be seen that the total film thickness in the Example is smaller than the total film thickness in Comparative Example 1 (substantially equal to the film thickness of the SiO film). Furthermore, it can be seen that the total film thickness in Comparative Example 2 is larger than the total film thickness in Comparative Example 1. That is, it can be appreciated that, by performing the substrate processing sequence of the above-described embodiments, the total thickness of the SiO film after modification and the interface layer whose composition has been changed by the modification can be prevented from increasing from the total thickness of the SiO film before modification and the interface layer before its composition is changed by the modification.

According to the present disclosure, when a film formed on a substrate is modified with plasma, it is possible to adjust the quality of the film over a wide range in the thickness direction of the film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) loading a substrate including a base and a first film containing silicon and formed on the base into a process container;
   (b) converting a modifying gas containing helium into plasma to generate reactive species of helium; and
   (c) supplying the modifying gas containing the reactive species of helium to a surface of the substrate to respectively modify the first film and an interface layer of the base constituting an interface with the first film,
   wherein in (c), a total thickness of the first film after modification and the interface layer whose composition has been changed by modification is adjusted by a ratio (B/A) of a flow rate B of an oxidant or a nitriding agent supplied into the process container to a flow rate A of a helium gas supplied into the process container.

2. The method of claim 1, wherein the first film before modification has a thickness that allows the reactive species of helium to spread into the first film throughout a thickness direction of the first film, and that allows the reactive species of helium to reach the interface layer through the first film.

3. The method of claim 2, wherein the thickness of the first film before modification is 10 nm or less.

4. The method of claim 1, wherein the first film before modification has a film density that allows the reactive species of helium to spread into the first film throughout a thickness direction of the first film, and that allows the reactive species of helium to reach the interface layer through the first film.

5. The method of claim 4, wherein the film density of the first film before modification is 3.00 g/cm3 or less.

6. The method of claim 1, wherein in (c), the total thickness of the first film after modification and the interface layer whose composition has been changed by modification does not increase beyond a total thickness of the first film before modification and the interface layer before the composition of the interface layer is changed by modification.

7. The method of claim 1, wherein in (c), an increase amount of a thickness of the interface layer whose composition has been changed by modification relative to the thickness of the interface layer before the composition of the interface layer is changed by modification does not exceed a decrease amount of a thickness of the first film after modification relative to the thickness of the first film before modification.

8. The method of claim 1, wherein the first film is a silicon oxide film, and
   wherein a gas containing the helium gas and the oxidant is used as the modifying gas.

9. The method of claim 8, wherein in (c), the first film is oxidized to allow a composition of the first film to approach a stoichiometric composition of silicon oxide.

10. The method of claim 8, wherein the interface layer before modification is a silicon layer, and
    wherein in (c), the interface layer is modified into a silicon oxide layer.

11. The method of claim 1, wherein the first film is a silicon nitride film, and
    wherein a gas containing the helium gas and the nitriding agent is used as the modifying gas.

12. The method of claim 11, wherein in (c), the first film is nitrided to allow a composition of the first film to approach a stoichiometric composition of silicon nitride.

13. The method of claim 11, wherein the interface layer before modification is a silicon layer, and
    wherein in (c), the interface layer is modified into a silicon nitride layer.

14. The method of claim 1, wherein in (c), the total thickness of the first film after modification and the interface layer whose composition has been changed by modification is equal to a total thickness of the first film before modification and the interface layer before the composition of the interface layer is changed by modification.

15. The method of claim 1, wherein in (c), an increase amount of a thickness of the interface layer whose composition has been changed by modification is equal to a decrease amount of a thickness of the first film after modification.

16. The method of claim 1, wherein the total thickness is adjusted to increase by increasing the ratio (B/A) in (c).

17. The method of claim 1, wherein the total thickness is adjusted to decrease by decreasing the ratio (B/A) in (c).

* * * * *